United States Patent [19]

Robertson

[11] Patent Number: 4,703,392
[45] Date of Patent: Oct. 27, 1987

[54] MICROSTRIP LINE AND METHOD FOR FABRICATION

[75] Inventor: Brian T. Robertson, Lynchburg, Va.

[73] Assignee: General Electric Company, Lynchburg, Va.

[21] Appl. No.: 799,965

[22] Filed: Nov. 20, 1985

Related U.S. Application Data

[60] Division of Ser. No. 659,503, Oct. 10, 1984, Pat. No. 4,600,663, which is a continuation of Ser. No. 395,336, Jul. 6, 1982, abandoned.

[51] Int. Cl.$^4$ .............................................. H05K 1/16
[52] U.S. Cl. .................................... 361/402; 361/411; 427/96; 333/246; 333/247; 174/68.5
[58] Field of Search .......................... 427/96; 174/68.5; 333/247, 246; 361/402, 411

[56] References Cited

U.S. PATENT DOCUMENTS

| | | | |
|---|---|---|---|
| 2,993,815 | 7/1961 | Treptow | 428/209 |
| 3,257,629 | 6/1966 | Kornreich . | |
| 3,274,328 | 9/1966 | Davis . | |
| 3,586,922 | 6/1971 | Johnson et al. . | |
| 3,808,049 | 4/1974 | Caley et al. . | |
| 4,029,562 | 6/1977 | Feng et al. . | |
| 4,072,771 | 2/1978 | Grier | 427/96 |
| 4,075,757 | 2/1978 | Malm | 427/96 |
| 4,090,006 | 5/1978 | Havas et al. . | |
| 4,094,704 | 6/1978 | Milnes . | |
| 4,152,679 | 5/1979 | Chen . | |
| 4,172,004 | 10/1979 | Alcorn et al. . | |
| 4,238,763 | 12/1980 | Gray et al. . | |
| 4,258,382 | 3/1981 | Harris . | |
| 4,316,942 | 2/1982 | Kuo | 428/432 |
| 4,540,604 | 9/1985 | Siuta | 427/96 |
| 4,553,111 | 11/1985 | Barrow | 361/410 |

OTHER PUBLICATIONS

M. Zipay et al. "Fabrication on Multilayered Structures" IBM Technical Disclosure Bulletin, vol. 12, No. 10, Mar. 1970, p. 1690.
Anon "Inks for Hybrid Match Alumina" Electronics, vol. 50, No. 2, p. 144, Jan. 20, 1977.
"The Microwave Hybrid Circuit: Fabrication–Processing Considerations" by Charles A. Wheeler Published by Film Micro Electronics, Inc., Sep., 1969, pp. 1–7.
"Thick Film Conductor Compositions:–Nitrogen Fireable Copper Conductor Composition 9923—by Dupont Electronic Materials, E-11728.
"Dupont Thick Film Conductor Compositions"—Copper Conductor Composition 9925.
"Enhanced Property Thick-Film Conductor Pastes" by R. G. Loasby et al., Microcircuit Technology Group.
"Thick Film Technology and Chip Joining" by Lewis F. Miller International Business Machines Corporation, pp. 35–36.
"Handbook of Thick Film Hybrid Microelectronics" by Charles A. Harper, Westinghouse Electric Corporation.

Primary Examiner—John D. Smith
Assistant Examiner—Vi Duong Dang
Attorney, Agent, or Firm—Nixon & Vanderhye

[57] ABSTRACT

A method for fabricating a microstrip resonator line permitting precise control of line width, edge definition and thickness. On a substrate, there is printed a first conductive layer having a precisely controlled width. This first layer has a thickness less than the desired thickness of the resonator line. Further conductive layers are printed over the first layer to build up to the desired thickness of the resonator line based on skin depth requirement at the frequency of operation. Each of the further conductive layers for building the thickness of the line has a width less than that of the first conductive layer so that resonator line width is controlled by the width of the first layer.

8 Claims, 2 Drawing Figures

MICROSTRIP LINE AND METHOD FOR FABRICATION

This is a division of application Ser. No. 659,503, filed Oct. 10, 1984, allowed Oct. 17, 1985, now U.S. Pat. No. 4,600,663, and which is a file wrapper continuation of Ser. No. 395,336, filed July 6, 1982, now abandoned.

BACKGROUND OF THE INVENTION

This invention relates in general to the fabrication of hybrid microelectronic circuits. More specifically, the invention relates to the fabrication of microstrip lines using a thick film process on a hybrid circuit substrate. It provides a novel fabrication technique that requires less labor and less specialized equipment than required for known thin film techniques and overcomes many of the difficulties associated with known thick film fabrication techniques.

Some of the problems attendant the fabrication of microwave hybrid circuits are discussed in a publication entitled THE MICROWAVE HYBRID CIRCUIT:-FABRICATION-PROCESSING CONSIDERATIONS by William J. MacDonald of Film Microelectronics, Inc., 17 A Street Burlington, Mass. and Charles A. Wheeler of Sanders Associates, Inc. Microwave Division, Nashua, N.H. The authors point out that R.F. current flowing through a film conductor may experience the "skin effect" phenomenon. Current concentration at the substrate (ceramic) metallization interface places certain requirements on film (conductor) thickness and the bonding mechanism by which the film adheres.

At microwave frequencies the conduction characteristics of a film line are a function, at least in part of line width and edge definition as well as line thickness. Using known copper plated silver and other thick film copper techniques, it is possible to fabricate a microstrip resonator line having sufficiently low loss and high-Q as now required by modern circuit designs. However, there is insufficient ability to accurately control both the width, edge definition and thickness of the thick film line applied to the substrate. Using known techniques, when multiple layers of copper are printed to develop the desired skin depth thickness, the overlapping of layers destroys any clear definition of edge and the width of the microstrip line becomes uncertain. This reduces the predictability of microstrip line characteristics.

It is possible to achieve good width, edge definition and the thickness control using thin film techniques in which chromium-gold or chromium-nickel-gold is sputtered onto the substrate. However, the use of thin film techniques requires elaborate and expensive machinery. The costs are prohibitive except for mass production.

An exemplary known thin film process for producing thin film microstrip lines includes the following method steps:

1. Vacuum deposit, i.e., either evaporate or sputter, approximately 500 Angstroms of titanium onto a 99.5% Al$_2$O$_3$ substrate.
2. Vacuum deposit copper until the total thickness is 2 microns. This produces a phased Cu Ti metallized layer which has high adhesion to the alumina substrate.
3. Copper is then electroplated onto the deposited metallization to increase the metal thickness to 27 microns, i.e, 25 microns of Cu is electrodeposited.
4. The desired pattern is then photoproduced using a liquid photoresist, exposing and developing to leave openings in the photoresist where the pattern is to remain.
5. 10-12 microns of gold is then electroplated onto the exposed copper.
6. The photoresist is removed leaving a solid plane of copper with a gold pattern plated onto it.
7. The copper and titanium are then etched from the substrate. The gold pattern acts as a mask so that the copper and titanium under the gold are not etched.

The resulting metallized pattern therefor includes
500 Angstrom Titanium
19,500 Angstrom Vacuum Deposited Copper
25 Microns Electroplated Copper
10-12 Microns Electroplated Gold The process steps required to produce a microstrip line of this nature requires a significant amount of labor and specialized equipment. The thick film technique set forth herein is more simple and requires less labor and specialized equipment.

A small sample of U.S. patents illustrate known techniques for fabricating microelectronic circuits as follows:

U.S. Pat. No. 4,152,679—Chen (May 1, 1979)
U.S. Pat. No. 3,808,049—Caley et al (Apr. 30, 1978)
U.S. Pat. No. 3,274,328—Davis (Sept. 20, 1966)
U.S. Pat. No. 2,257,629—Kornreich (June 21, 1966)

The subject matter of these patents are incorporated herein by reference. This is not intended to be an exhaustive list but only a small sample of the U.S. patents issued in the general art area to which this invention pertains.

SUMMARY OF THE INVENTION

In order to overcome the difficulties associated with fabricating microstrip lines using known thick film techniques without having to resort to the use of expensive and complicated thin film techniques, there is provided a novel thick film fabrication technique.

There is printed on a substrate a first layer of copper which has a high adhesion to the Al$_2$O$_3$ substrate. This first layer is used to accurately define the width and edge of the microstrip line. A second layer of copper is applied over the first layer. This second layer can have a lower loss than the first layer and a lower adhesion to Al$_2$O$_3$ than the first layer. However, in combination with the first layer, the adhesion of the completed line would exceed minimum specification requirements. The second layer is used to build-up the thickness of the line to a desired level, such as for example five (5) skin depths at 150 mHz. It is applied with a width that is slightly less than the width of the first layer. This permits the first layer to continue to define the width and edge of the microstrip line.

Using this technique, it is possible to achieve all of the benefits of double printing thick film copper such as multiple skin depths, low loss and high Q without the detrimental effects of double printing, namely loss of width control and edge definition.

BRIEF DESCRIPTION OF THE DRAWINGS

The invention will be described in its presently preferred exemplary embodiment with reference to the drawings wherein.

DETAILED DESCRIPTION OF THE PREFERRED EMBODIMENTS

Referring now to the Figures a preferred exemplary embodiment of the invention will be described.

Figure 1:
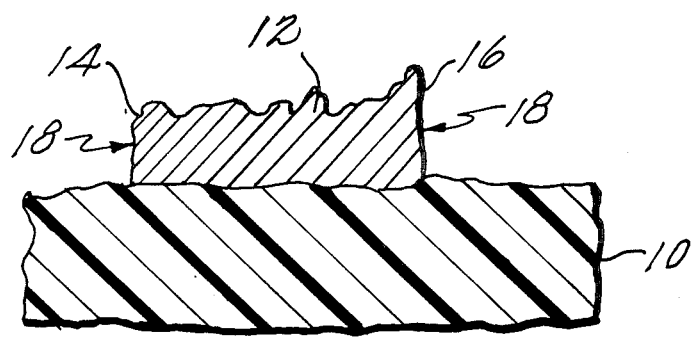
FIG. 1 is a front view of the microstrip line after the first layer has been applied for accurately defining its edge and width and FIG. 2 is a front view of the microstrip line after application of a second layer having a width narrower than the first layer, the second layer being used to increase the thickness of the line without destroying the edge definition of the first layer.

Referring first to FIG. 1, the fabrication process begins with the provision of a conventional substrate 10. Substrate 10 can be a conventional alumina substrate used in known hybrid circuit fabrication processes. A first thick film copper layer 12 is applied. This first copper layer is preferably fabricated from DP 9923 glass frit bonded thick film conductor composition. DP 9923 is a product of the E. I. Du Pont de Nemours Company, Inc. (DuPont) and is fully described in its data sheet #E-11728 (9/76). Layer 12 is applied with precise control of the left and right edge portions 14 and 16 so as to achieve precise control over the width 18 of the layer. The DP 9923 has sufficient adhesion to firmly attach to substrate 10.

Figure 2:
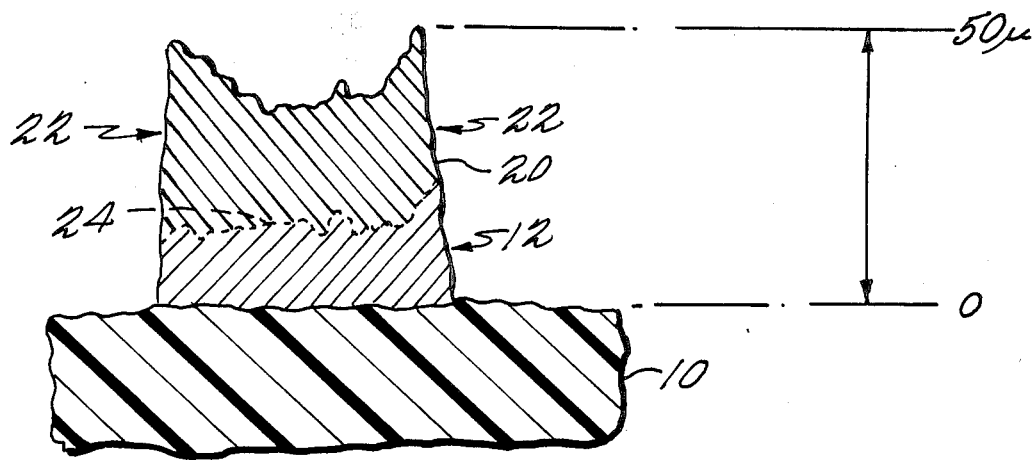

Referring now to FIG. 2, the remaining fabrication steps are shown. After layer 10 is fired, a second layer 20 is printed over the first layer. Layer 20 is applied to build-up the total thickness of the microstrip line to the desired number of skin depths. This second layer 20 is preferably DP 9925 which is a reactive bonded (oxide copper) copper conductor composition having a lower loss than the DP 9923 used for layer 12. The DP 9925 is also a product of duPont. Layer 20 is applied such that its width 22 is less than width 18 of layer 12. Thus, the precise control over width 18 and the edge definition 14 and 16 thereof are not interfered with. The charcteristics of the microstrip line determined by edge definition and width are controlled by that portion of the line closest to the substrate 10. By adding layer 20 on top of layer 12, the desired number of skin depths can be obtained without sacrificing the precise width and edge definition control afforded by the use of a precisely controllable medium for layer 12 such as DP 9923 copper. In FIG. 2, the interface line 24 between layers 12 and 20 is shown dotted. The DP 9925 having a lower loss can be used for the formation of layer 20 without the requirement of precise edge control as needed for layer 12. If necessary additional layers can be printed on top of layer 20 in order to build up to the desired skin-depth as long as the additional layers have a width that is less than that of layer 12 so as not to interfere with its precise edge definition.

While the invention has been described in connection with what is presently considered to be the most practical and preferred embodiment it is to be understood that the invention is not to be limited to the disclosed embodiment but on the contrary it is intended to cover various modifications and equivalent arrangements included within the spirit and scope of the appended claims which scope is to be accorded the broadest interpretation so as to encompass all such modifications and equivalent structures.

What is claimed:

1. A method for fabricating a microstrip line, comprising the steps of:
    (a) providing a substrate;
    (b) printing a first glass frit-bonded thick film copper conductive layer of said line on said substrate, said first layer having a predetermined width and a thickness less than the desired thickness of the line; and
    (c) printing a second oxide-bonded thick film copper conductive layer over said first layer, said second layer having a width smaller than that of said first layer.

2. A method according to claim 1 wherein said step (b) comprises the step of printing a first layer of DP 9923 glass frit bonded thick film copper.

3. A method according to claim 1 or 2 wherein said step (c) comprises the step of printing an additional layer of DP 9925 reactive bonded copper.

4. A microstrip line formed by the following steps:
    (a) providing a substrate;
    (b) printing a first glass frit-bonded thick film copper conductive layer of said line on said substrate, said first layer having a predetermined width and a thickness less than the desired thickness of the line; and
    (c) printing a second oxide-bonded thick film copper conductive layer over said first layer, said second layer having a width smaller than that of said first layer.

5. A microstrip line according to claim 4 wherein fabrication step (b) comprises the step of printing a first layer of DP 9923 glass frit bonded thick film copper.

6. A microstrip line according to claim 4 or 5 wherein fabrication step (c) comprises the step of printing an additional layer of DP 9925 reactive bonded copper.

7. A method according to claim 1 further comprising the step of:
    printing one or more additional layer of oxide-bonded thick film copper on top of said second layer.

8. A microstrip line formed by the steps of claim 4 and the further step of:
    printing one or more additional layers of oxide-bonded thick film copper on top of said second layer.

* * * * *